United States Patent
Bruce et al.

(10) Patent No.: US 6,577,406 B2
(45) Date of Patent: Jun. 10, 2003

(54) STRUCTURE FOR LITHOGRAPHIC FOCUS CONTROL FEATURES

(75) Inventors: James A. Bruce, Williston, VT (US); Orest Bula, Shelburne, VT (US); Emily E. Fisch, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,551

(22) Filed: Jan. 17, 2002

(65) Prior Publication Data

US 2002/0122187 A1 Sep. 5, 2002

Related U.S. Application Data

(60) Provisional application No. 60/272,608, filed on Mar. 1, 2001.

(51) Int. Cl.[7] .............................................. G01B 11/00
(52) U.S. Cl. ........................................... 356/625; 430/5
(58) Field of Search ................................. 356/625, 614, 356/123, 124, 125, 126, 127, 634, 635, 636, 401, 400; 250/548; 430/22, 30, 5

(56) References Cited

U.S. PATENT DOCUMENTS

| | | | |
|---|---|---|---|
| 5,629,772 A | | 5/1997 | Ausschnitt |
| 5,757,507 A | | 5/1998 | Ausschnitt et al. |
| 5,790,254 A | | 8/1998 | Ausschnitt |
| 6,137,578 A | * | 10/2000 | Ausschnitt ................ 356/399 |
| 6,417,929 B1 | * | 7/2002 | Ausschnitt ................ 356/635 |

OTHER PUBLICATIONS

Ausschnitt, et al. "Seeing the Forest for the Trees: A New Approach to CD Control" SPIE vol. 3332, 0277–786X/98 pp 212–220.

Christopher P. Ausschnitt, "Distinguishing Dose From Defocus for In–Line Lithography Control" SPIE vol. 3677, 0277–786X/99 pp. 140–147.

David Ziger and Pierre Leroux, VLSI Technology, San Antonio, Texas "Understanding Optical End of Line Metrology" Part of the SPIE Conference on metrology, Inspection and Process Control for Microlithography XIII, Santa Clara, CA SPIE vol. 3677, 0277–786X/99, pp 194–205.

Ausschnitt, et al., "Process Window Metrology" In Metrology, Inspection and Process Control for Microlithography XIV, Neal T. Sullivan, Editor Proceedings of SPIE vol. 3998 (2000), 0277–786X/00, pp 158–166.

Young–Chang Kim et al., "Automatic In–Situ Focus Monitor Using Line Shortening Effect" Part of the SPIE Conference on Metrology, Inspection and Process Control for Microlithography XIII, Santa Clara, CA, SPIE vol. 3677, 0277–786X/99, pp 184–193.

* cited by examiner

*Primary Examiner*—Hoa Q. Pham
(74) *Attorney, Agent, or Firm*—Richard M. Kotulak

(57) ABSTRACT

A control target structure and method for monitoring the lithographic affects on minimum feature in a lithographic process. The control target uses line array elements having a nominal width. By changing the shape of the line-ends of the elements the control target can be optimized for controlling either focus or dose.

20 Claims, 6 Drawing Sheets

STRUCTURE FOR LITHOGRAPHIC FOCUS CONTROL FEATURES

BACKGROUND OF THE INVENTION

This invention claims priority based on Provisional Patent Application No. 60/272,608 filed on Mar. 1, 2001.

FIELD OF THE INVENTION

The present invention relates to targets for in-line lithography process control. More particularly these targets are used in the monitoring of lithographic and etch processes used in microelectronics manufacturing.

BACKGROUND OF THE INVENTION

Lithography has a broad range of industrial applications including the manufacture of semiconductors, displays, micro-machines and disk heads.

The lithographic process allows for a mask or reticle pattern to be transferred via spatially modulated light to a photoresist film on a substrate. Those segments of the absorbed aerial image, whose energy exceeds a threshold energy of chemical bonds in the photoactive component of the photoresist material, create a latent image in the photoresist. In some photoresist systems the latent image is formed directly by the photoactive component; in others the photochemical interaction first generates acids which react with other photoresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. "Exposure" and "focus" are the primary variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

Generally, because of the variations in exposure and focus, patterns developed by lithographic processes must be continually monitored or measured to determine if the dimensions of the patterns are within acceptable range. The importance of such monitoring increases considerably as the resolution limit, usually defined as minimum feature size resolvable, of the lithographic process is approached. The patterns being developed in semiconductor technology are generally in the shape of lines both straight and with bends, having a length dimension equal to and multiple times the width dimension. Since the width dimension is the minimum dimension of the patterns, it is the width dimension that challenges the resolution limits of the lithographic process. The term bias is used to describe the change in a dimension of a feature from its nominal value. Usually the bias of interest is the change in the smallest of the dimensions of a given feature.

As the lifetime of optical lithography is extended, the microelectronic industry pushes the 248 nanometer tools well beyond their intended specifications. Throughout the industry, smaller line widths and tighter tolerances are achieved by exploiting image enhancement techniques like phase-shift masks, off-axis illumination, and optical proximity correction. These enhancements have been sufficient to demonstrate process capability, but cannot guarantee routine manufacture of line widths below 0.2 microns. The lithography tools run well beyond specifications under manufacturing conditions, rendering historical tool controls inadequate. While wafer flatness, underlying film stacks, resist uniformity, and lithographic tool conditions all influence the final resist images, both focus and dose are tool process conditions which can be adjusted easily to control the critical resist image dimension (CD). A good control scheme should integrate both focus and dose adjustments to deliver the desired resist image.

SUMMARY OF THE INVENTION

Therefore the need for wafer-level understanding and control of dose and defocus stresses the importance of detecting dose and focus shifts. What is needed is a better way of detecting the subtle shifts in both due to line-shortening affects. What the inventors have discovered is that changing the shape of line-ends in the process control targets used can influence the sensitivity of the detection of either dose or focus shifts. The inventors change the bias of the line-ends used in the control targets to either increase or decrease the sensitivity to focus or dose. These line and shapes designs are referred to as anchors and noses.

BRIEF DESCRIPTION OF THE DRAWINGS

These and other features, aspects and advantages will be more readily apparent and better understood from the following detailed description of the invention, in which.

DETAILED DESCRIPTION OF THE PREFERRED EMBODIMENT

The importance of focus on image quality motivates a more inclusive monitoring technique. Line-end shortening of resist features is an indicator of process window for both dose and focus. Prior work has demonstrated the use of control targets that leverage this effect. An example of one such control target is a schnitzl. A description of what a schnitzl is appears in U.S. Pat. No. 5,629,772 granted to Christopher Ausschnitt of IBM.

Figure 1:
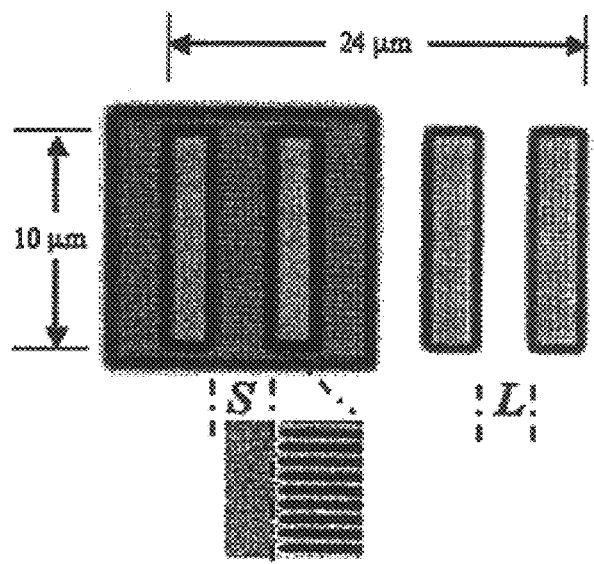
FIG. 1 is an optical view of a process control target.

This target is shown in FIG. 1. It consists of a pair of line arrays on a clear background adjacent to a pair of trough or space arrays on a resist background. The lines and spaces have the same design size and layout. The distance between the two line arrays (L) and the two space arrays (S) becomes the control metric. Typically, the line width and pitch of the individual target lines in the arrays are comparable to the minimum feature on the chip.

The pair of space arrays is contained within a block of resist adjacent to the pair of line arrays. The space array separation S and the line array separation L are the control dimensions. Typically, the line length, trough length and array separation are 3.0 microns. The fine structure of the array lines is not resolved optically, so an SEM magnification is also shown.

There are some basic requirements for the pair of monitor features. The features should have overlapping process windows so they can both be printed clearly throughout the dose and focus parameter space. The features must be designed for ease of measurement. The features should change systematically and measurably as the focus and dose are varied to generate a strong response for effective modeling. Finally, the features should have a response that is separable in either dose or focus, but not both.

Figure 2:
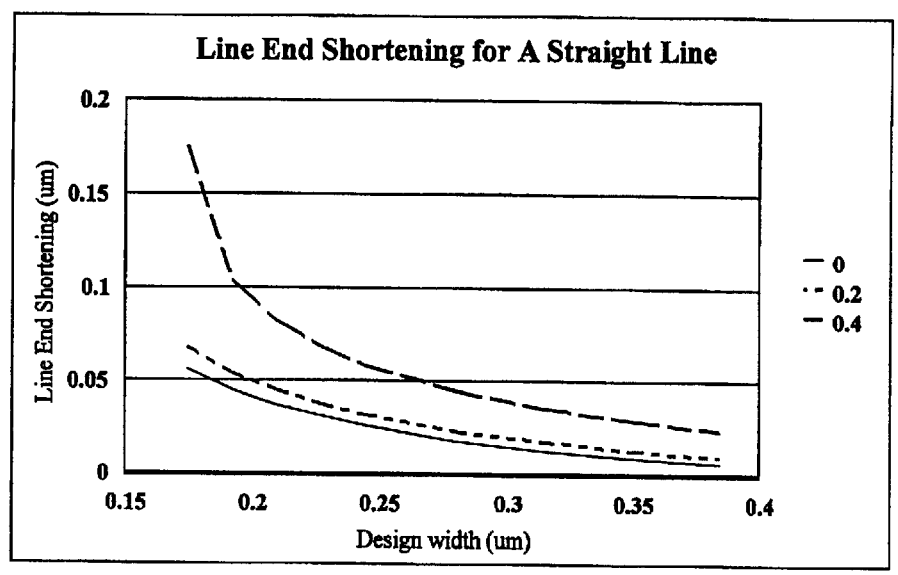
FIG. 2 is a plot of line-end shortening as a function of design line width for a single line at three different defocus values.

FIG. 2 is a plot of line-end shortening as a function of design line width for a single line at three different defocus values. As illustrated in FIG. 2 smaller line-ends shorten more readily. This invention takes advantage of this by changing the shape of the line ends in the line arrays. By changing the shape of the line ends, the desired target response can be achieved and the control target can be optimized. One of the goals of this invention is to have structures with the same focus response, but opposite dose response so the effects are distinguishable. This is important since the inverted space design does not print on the wafer as well as the line design, creating noisy data.

Figure 3A:
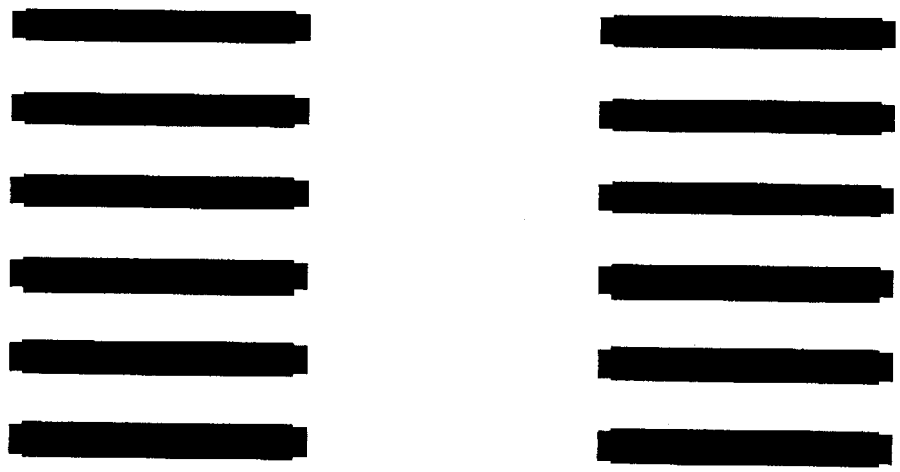
FIGS. 3a and 3b are magnified views of a "small nose" line-end design and a "small nose" space design respectively.
Figure 3B:
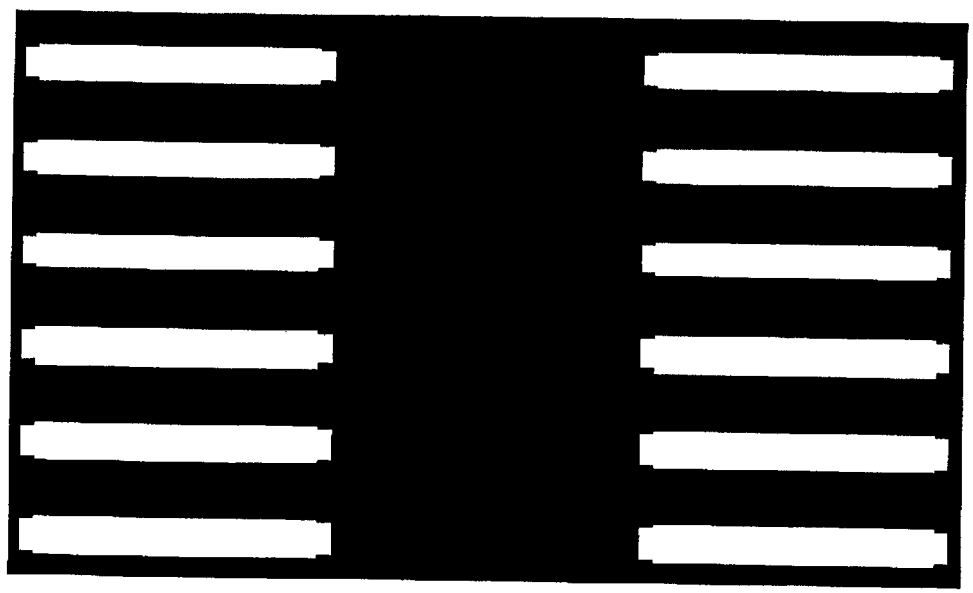
Figure 4A:
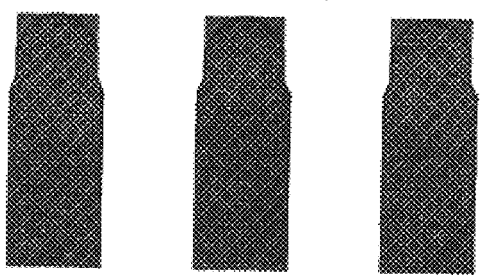
FIGS. 4a and b illustrates line-end images for the small nose design on 175 nm. lines at a 350 nm. pitch.
Figure 4B:
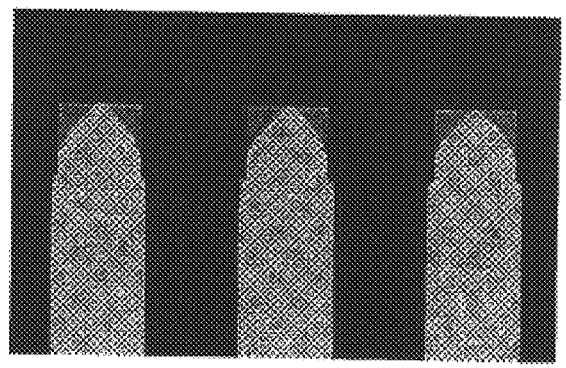

FIGS. 3a and 3b are magnified views of a "small nose" line-end design (3a) and "small nose" space design (3b) respectively. FIGS. 4a and b illustrates line-end images for the small nose design on 175 nm lines at a 350 nm pitch. The square pattern indicates the design that is printed on the wafer after mask processing. Notice that the space array line-ends of 4b shorten more than the line array line-ends which helps explain the different $a_o$-term for each.

Figure 5:
FIG. 5 is an example of a hammer or anchor line design.
Figure 5:

FIG. 5 is an example of a hammer or anchor line design. Assisting the line end by adding an anchor shape end reduces and the corner rounding on the mask level and prints a line the wafer that is less sensitive to focus changes. In other words, the foreshortening as a function of focus is reduced. The inverse is also possible. Adding noses to the lines increases the mask corner rounding and increases foreshortening on the printed wafer.

Table 1 below provides the details of several designs that illustrate this response. It uses a model which characterizes the dose and focus response based on the array design where the line ends.

The model to characterize the dose and focus response is generated from measurements of the two features (L and S) through dose and focus. The details of the model are described in C. P. Ausschnitt, "Distinguishing dose from defocus for in-line lithography control," Proceeding of the SPIE, 3677 (1999). The response of these features are separated and a parametric model defined in the vicinity of optimal dose and focus:

$$L = a_0 L + a_1 L\ E + a_2 L(Z)_2 \quad (1)$$
$$S = a_0 S + a_1 S\ E + a_2 S(Z)_2 \quad (2)$$

Where normalized dose and defocus are, respectively $$E = EF_{EM}/E_0 \quad (3)$$

and $$Z = zF_{EM} - z_0 \quad (4)$$

The "$F_{EM}$" subscript denotes the process tool variable and the "$_0$" denotes optimal operating point. While $E_0$ depends on the desired CD of the features, $z_0$ is a constant of the system. The model requires that E and Z be the same for lines and spaces.

Now, when a series of L and S data is either simulated or measured through dose and focus, there is a systematic way of analyzing it. Using a least squares fit, Equations (1) and (2) are solved simultaneously to yield a table of nine coefficients. Since the coefficients associated with L and S are a measure of the features' response, they can be used to quantify the performance of a given design. Each coefficient also has a quasi-physical significance: $a_0$ is the feature size at optimal dose and focus, a1 is the feature's first order dose sensitivity, and $a_2$ is the sensitivity to defocus. With this tool process targets can be compared and tailored for improved printing and measurement.

In Table 1 below the model coefficients are listed by design name. The bias numbers are the deviation per edge of the line and space ends. Each line array design is matched to its complementary space array.

TABLE 1

| Line-end | Line-end | $a_{0L}$ | $a_{0S}$ | $a_{1L}$ | $a_{1S}$ | $a_{2L}$ | $a_{2S}$ | $z_0$ |
|---|---|---|---|---|---|---|---|---|
| Large Anchor | 12.5 | 1.95 | 4.47 | 1.19 | −1.5 | 2.78 | 2.93 | 0.1 |
| Small Anchor | 6.25 | 1.87 | 4.56 | 1.29 | −1.6 | 3.06 | 2.88 | 0.1 |
| Lines | 0 | 1.8 | 4.6 | 1.35 | −1.6 | 3.15 | 2.81 | 0.1 |
| Small Nose | −6.25 | 1.79 | 4.67 | 1.42 | −1.6 | 3.3 | 2.77 | 0.09 |
| Large Nose | −12.5 | 1.79 | 4.72 | 1.45 | −1.7 | 3.32 | 2.74 | 0.09 |
| Lines @ 325 nm | 0 | 2.27 | 4.11 | 0.86 | −1.0 | 2.56 | 1.2 | 0.07 |
| Lines @ 425 nm | 0 | 2.12 | 4.61 | 1.03 | −1.6 | 1.8 | 2.31 | 0.07 |

A way to compare the effects of adding bias to line-ends in a consistent way is to examine the model coefficients that are listed in Table 1. The analysis is somewhat qualitative, but trends are clearer because of the analysis. By incorporating the physical significance of each coefficient, as discussed above, the following is noted:

1. $A_0$ is a constant that represents the nominal line width. The difference in line vs. space $a_0$ is not significant since it merely reflects the printed mask bias between lines and spaces which could be compensated in the design data.

2. The primary dose response is represented by the magnitude of the $a_1$ coefficients. Adding "anchors" decreases the line arrays' dependence on dose; adding "noses" increases the dose-dependence slightly. The complementary anchor space array shows a less dramatic, but consistent change. Changing pitch does not alter the dose response much.

3. The focus response is given by the magnitude of $a_2$. The focus response increases as the line-end is decreased from a large anchor to a small nose. Increasing the pitch also increases the focus response. In both cases, the increase in focus response is more pronounced for the line arrays than for the space arrays because the space line-end data is broadened during the mask build simulation.

Thus, it is possible to fine-tune the array response depending on whether interest is monitoring dose or focus. Adding "anchors" to the line-ends decreases the dose dependence of the array. Creating a "nose" on the line-end does not change the dose dependence much, but increases the focus response. Since the line measurements are usually much cleaner than the space, using a mixture of line-end designs for a single tone, dual line-end process control target is a reasonable approach.

There are other types of assist features that can be deployed in addition to what the inventors have called "anchors" and "noses." Other lithography extension techniques include: adding sub-minimum assist features, adding serifs to line-ends, etc. could be employed to modify the response to dose and focus on a similar manners to modify the foreshortening of line ends to suit the particular parameter or parameters being monitored.

Thus while the invention has been described in terms of specific embodiments, other alternatives, modifications and variations will be apparent to those skilled in the art. Thus, the invention is intended to encompass all such alternatives, modifications and variations which fall within the scope and spirit of the invention and the appended claims.

What is claimed is:

1. A process control target for a lithographic process which comprises:

an array having a plurality of elements of nominal width and nominal length, the elements having a line-end shape that is modified from the nominal width based on sensitivity to focus.

2. The process control target of claim 1, wherein the line-end is in the form of an anchor.

3. The process control target of claim 1, wherein the line-end is in the form of a nose.

4. The process control target of claim 1, wherein the line-end shape's width is larger than the nominal width of the line.

5. The process control target of claim 1, wherein the line-end shape's width is smaller than the nominal width of the line.

6. The process control target of claim 1, wherein the control target is a plurality of arrays.

7. The process control target of claim 6, wherein one set of the arrays is a line end design and the second set is a space design.

8. The process control target of claim 7, wherein the line-ends for the line end design and the space design are noses.

9. The process control target of claim 7, wherein the line-ends for the line end design and the space design are anchors.

10. The process control target of claim 1, wherein the line-end shape is modified with a sub-minimum resolution assist feature.

11. The process control target of claim 10, wherein the line-end shape is modified with serifs.

12. A process control target for a lithographic process which comprises:

an array having a plurality of elements of nominal width and nominal length, the elements having a line-end shape that is modified from the nominal width based on sensitivity to dose.

13. The process control target of claim 12, wherein the line-end is in the form of an anchor.

14. The process control target of claim 12, wherein the line-end shape's width is larger than the nominal width of the line.

15. The process control target of claim 12, wherein the line-end shape's width is smaller than the nominal width of the line.

16. The process control target of claim 12, wherein the line-end shape is modified with a sub-minimum resolution assist feature.

17. A method for determining the shape of an end-line shape for a process control target for a lithographic process comprising the steps of:

measuring the line and shape separation between a line-shortening space arrays and a line arrays having differing end-line shapes;

selecting the appropriate sensitivity for dose or focus used in the lithographic process based on line and shape separation measurements derived from a model which characterizes dose and focus response.

18. The method claim 17, wherein the model is a parametric model.

19. The method of claim 18, also comprising the step of, selecting line-end bias according to coefficients contained in the model.

20. The method of claim 17 where the space and line arrays are maximized for best focus.

* * * * *